United States Patent
Matsudate et al.

(10) Patent No.: US 8,441,186 B2
(45) Date of Patent: May 14, 2013

(54) ORGANIC ELECTROLUMINESCENCE DISPLAY DEVICE

(75) Inventors: Noriharu Matsudate, Kujukuri (JP); Takeshi Ookawara, Mobara (JP); Kenta Kajiyama, Mobara (JP)

(73) Assignees: Hitachi Displays, Ltd., Chiba (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 3 days.

(21) Appl. No.: 12/769,978

(22) Filed: Apr. 29, 2010

(65) Prior Publication Data

US 2010/0213456 A1 Aug. 26, 2010

Related U.S. Application Data

(62) Division of application No. 11/678,695, filed on Feb. 26, 2007, now Pat. No. 7,714,506.

(30) Foreign Application Priority Data

Feb. 27, 2006 (JP) ................................ 2006-051282

(51) Int. Cl.
H01J 1/62 (2006.01)
(52) U.S. Cl.
USPC ............................................. 313/506; 257/40
(58) Field of Classification Search .......... 313/503–507; 257/40
See application file for complete search history.

(56) References Cited

U.S. PATENT DOCUMENTS

| 7,285,497 | B2 | 10/2007 | Yotsuya |
| 7,285,906 | B2 | 10/2007 | Ohshita |
| 2003/0164674 | A1* | 9/2003 | Imamura ........................ 313/493 |
| 2005/0001546 | A1 | 1/2005 | Yamaguchi |
| 2005/0016463 | A1 | 1/2005 | Hirano |
| 2006/0055317 | A1* | 3/2006 | Baik et al. ..................... 313/504 |
| 2007/0187759 | A1* | 8/2007 | Lee et al. ...................... 257/347 |

FOREIGN PATENT DOCUMENTS

| CN | 1575058 | 2/2005 |
| JP | 2004-281339 | 10/2004 |
| JP | 2005-293917 | 10/2005 |

* cited by examiner

*Primary Examiner* — Anh Mai
*Assistant Examiner* — Brenitra M Lee
(74) *Attorney, Agent, or Firm* — Antonelli, Terry, Stout & Kraus, LLP.

(57) ABSTRACT

An organic electroluminescence display device is disclosed wherein plural organic electroluminescence elements each having an anode, a cathode and an organic layer sandwiched in between the anode and the cathode, the plural organic electroluminescence elements including organic electroluminescence elements developing different colors in a row direction, and at least one of the organic layers having an outer edge of a conic section at an end portion in a column direction thereof, the outer edge of the conic section becoming narrower gradually in its width in a row direction of vapor deposition thereof toward an extreme end at an end portion in a column direction thereof. The organic electroluminescence display device can improve the vapor deposition accuracy and the degree of design freedom.

8 Claims, 5 Drawing Sheets

US 8,441,186 B2

ORGANIC ELECTROLUMINESCENCE DISPLAY DEVICE

CROSS REFERENCE TO RELATED APPLICATION

This application is a divisional application of U.S. application Ser. No. 11/678,695, filed Feb. 26, 2007, now U.S. Pat. No. 7,714,506 the contents of which is incorporated herein by reference.

CLAIM OF PRIORITY

The present application claims priority from Japanese Application JP 2006-051282 filed on Feb. 27, 2006, the content of which is hereby incorporated by reference into this application.

BACKGROUND OF THE INVENTION (1) Field of the Invention

The present invention relates to a vapor deposition area of an organic layer in an organic electroluminescence (EL) display device.

(2) Description of the Related Art

As methods for forming a film of an organic layer of an organic EL display device there are known a printing method and a vapor deposition method. It is mainly the vapor deposition method that is practically applied to an organic EL display device using a low molecular organic material. Also as to an upper electrode, a film is formed mainly by vapor deposition.

A laminate structure of a conventional organic film is composed of an anode electrode as a lower electrode, a hole injection layer, a hole transport layer, a light emitting layer, an electron transport layer, and a cathode electrode as a combined upper electrode and electron injection layer of LiF/Al.

In case of adopting a distinctive coating method which affords light emitting layers different pixel by pixel, it is also known to form the anode electrode, hole injection layer, hole transport layer and cathode electrode as a continuous film common to all pixels and effect coating distinctively pixel by pixel causing the electron transport layer and the light emitting layer to emit light.

The present inventor has been studying the structure of a bottom emission active matrix type organic EL display device. According to this structure now under study, the metal of a cathode serving as an upper electrode is formed as a film just above an organic film and, for the supply of voltage to the cathode, the cathode is connected through a bank contact hole to an electrode (cathode contact) provided on a circuit board wiring.

Heretofore, contact holes for cathode contacts have not been disposed near pixels because of a poor deposition accuracy using a vapor deposition mask. In the sense of preventing a lowering of cathode voltage it is preferable that the number of cathode contacts be as large as possible and be positioned near pixels. When the degree of design freedom is taken into account, it is preferable that the number of areas where cathode contacts can be disposed be as large as possible.

A conventional vapor deposition mask is poor in vapor deposition accuracy particularly at an opening end thereof and, when it is intended to form a uniform film including display pixels, it has heretofore been required to vapor-deposit an organic layer up to an area going largely over a display pixel area and a dummy pixel area.

It is an object of the present invention to provide an organic EL display device which is high vapor deposition accuracy even if the vapor deposition area located outside display pixels and dummy pixels is small and which can improve the degree of design freedom.

SUMMARY OF THE INVENTION

The present inventor has noticed that a lowering of the vapor deposition accuracy is attributable to a vapor deposition mask. Generally, for vapor-depositing an organic luminescence layer in an organic EL display device, there is used a tension mask which is kept level under tension. In order to ensure the accuracy of the tension mask it is important that the tension applied to the mask be maintained optimal. A vapor deposition mask is fabricated by bonding a precision-machined metallic mask sheet of 50 to 200 µm in thickness to a metallic mask frame having an outline shape of 500 mm×400 mm and a width of 50 mm and a thickness of 25 mm under the application of a predetermined tension to keep the mask sheet level.

The vapor deposition mask is designed so as to permit vapor deposition highly accurately at a predetermined position on a substrate of an organic EL display device through fine holes formed by machining in a thin sheet. When a thermal stress is applied to the vapor deposition mask in a vapor deposition process, there occurs a fine deformation, causing a vapor deposition displacement.

An end portion in the column direction of a conventional vapor deposition mask is shown in FIG. 1. As shown in the same figure, in the conventional vapor deposition mask, indicated at M-MET1, the shape of an end portion M-EDGR1 of a hole M-APR1 is rectangular. Stress is concentrated on two vertexes M-EDG1 of the hole. In such a structure, not only there occurs a large distortion of the mask as the end portion, but also it is very difficult to make a mask design which takes distortion into account. When the mask undergoes various stresses in a mask assembling process or in a vapor deposition process, stress is concentrated on the mask hole. In this case, it is on the mask end portion, more particularly corners of the end portion, that the stress induced in the mask concentrates. In the case where the mask end portion is square in shape, the stress is concentrated on two places, causing deterioration of the mask accuracy.

In view of the above-mentioned point, in connection with an organic EL display device wherein plural EL elements each having an anode, a cathode and an organic layer sandwiched in between the anode and the cathode are arranged in a matrix shape, the present inventor has constructed the display device such that, in the case where the plural organic EL elements include organic EL elements developing different colors, at least one of the organic layers becomes narrower gradually in its width in a row direction of vapor deposition thereof toward an extreme end at an end portion in a column direction thereof.

According to the present invention it is possible to improve the vapor deposition accuracy and improve the degree of design freedom.

DETAILED DESCRIPTION OF THE PREFERRED EMBODIMENTS

The present invention will be described in detail hereinunder by way of embodiments thereof.

[First Embodiment]

Figure 1:
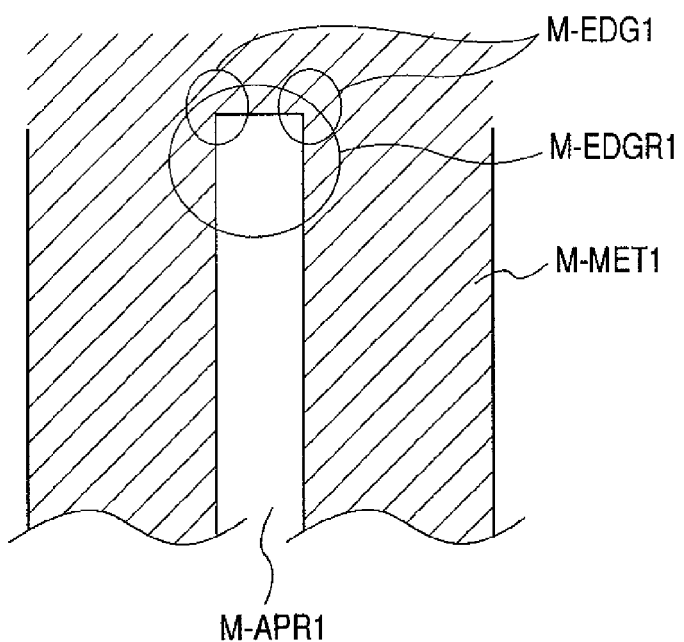
FIG. 1 is a diagram showing an end portion in a column direction of a conventional vapor deposition mask.
Figure 2:
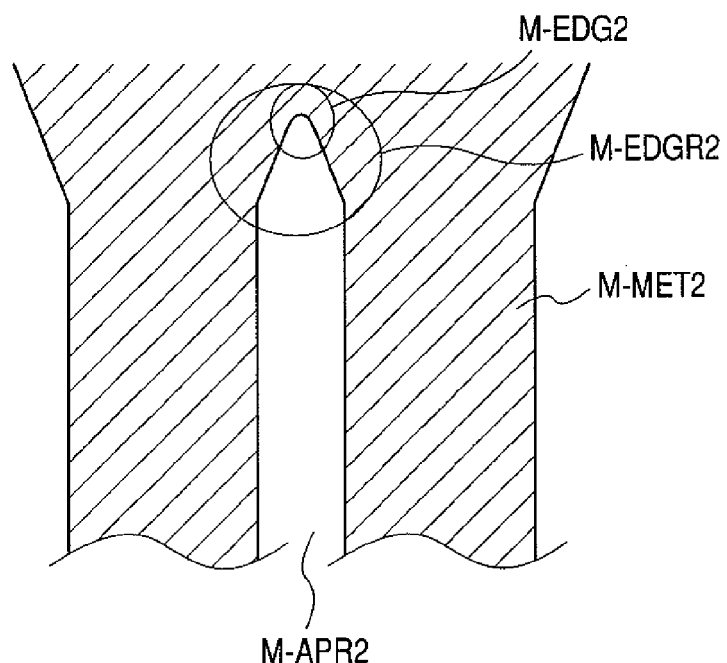
FIG. 2 is a diagram showing an end portion in a column direction of a vapor deposition mask according to the present invention.

The shape of a vapor deposition mask according to the present invention is shown in FIG. 2. In this vapor deposition mask, the width of an end portion M-EDGR2 of a hole M-APR2 in a mask portion M-MET2 is gradually narrowed like an outwardly convex curved line and a vertex M-EDG2 thereof is rounded to disperse stress.

This shape can be designated a generally triangular shape having a round tip, but it is not always necessary that the end portion be curved or rounded. There may be adopted a structure wherein straight lines are connected in a continuous manner. However, a differentiable curved line is preferred. As to the type of this curved line, a curved line capable of being approximated to a conic section or a quadratic curve is preferred. A curved line capable of being approximated to an ellipse, a parabola or a hyperbola is more preferred. The most effective shape in comparison with a rectangular shape is a shape capable of being designated a generally triangular shape having a rounded tip.

In the conventional vapor deposition mask, since an end portion of the mask has a corner such as, for example, a right-angled corner, stress is concentrated thereon. On the other hand, in this embodiment, a hole end portion of the vapor deposition mask is formed in a generally triangular shape, the side portion is curved and the tip is rounded, whereby the place where the stress induced in the vapor deposition mask is most concentrated can be limited to one place and the stress can be dispersed by the curved line. As a result, the vapor deposition accuracy of the organic luminescence layer can be improved from the conventional accuracy of ±10 μm to ±5 μm.

Figure 3:
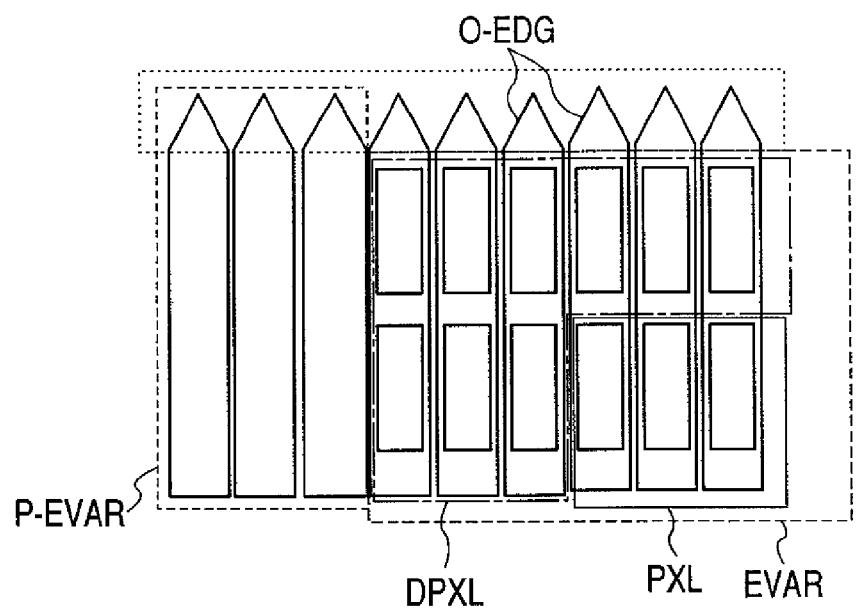
FIG. 3 is a planar pattern of an organic layer vapor-deposited using the vapor deposition mask shown in FIG. 2.

FIG. 3 is a planar pattern of a vapor-deposited organic layer in the organic EL display device using this vapor-deposition mask. A vapor deposition area EVAR is present so as to cover a display pixel area PXL and a dummy pixel area DPXL and vapor deposition ends O-EDG of the organic film are present at an end portion in the column direction of the vapor deposition area EVAR. Moreover, a preliminary vapor deposition area P-EVAR is vapor-deposited over three pixels in the row direction of the dummy pixel area and vapor deposition ends O-EDG of the organic film are present also in the column direction of the preliminary vapor deposition area P-EVAR. The shape illustrated in FIG. 2 is transferred as the shape of the vapor deposition ends O-EDG. However, if the shape is approximately the shape explained above in connection with the end portion of the vapor deposition mask, there occurs a blur. Even the occurrence of the blur falls under the scope of the present invention insofar as the end portion is vapor-deposited in a generally triangular shape.

More specifically, it is preferable that a solid vapor deposition mask for performing vapor deposition for the whole of the pixel area be used for the vapor deposition of both hole injection layer HIL and hole transport layer HTL and that the mask according to the present invention be used for both luminescence layer EML and electron transport layer ETL. That is, the organic EL display device is provided with the aforesaid vapor deposition film for both luminescence layer EML and electron transport layer ETL.

[Second Embodiment]

The following description is now provided about another structure of an organic EL display device which could be implemented by the using the vapor deposition mask of the first embodiment which made vapor deposition possible up to near the outside of the dummy pixel area. In case of forming a cathode metal into a film by the conventional vapor deposition method, the heat energy of metal particles is large because vapor deposition is performed at a very high temperature. It is presumed that when the metal particles adhere to a circuit board, there will occur a film stress due to a difference in temperature between the metal particles and the circuit board, with a consequent increase of contact resistance in the cathode contact portion. This increased contact resistance acts as an internal resistance of the organic EL display element, causing an increase of the organic EL display device driving voltage, and it has been one of factors of an increase in power consumption of the organic EL display device.

Figure 4:
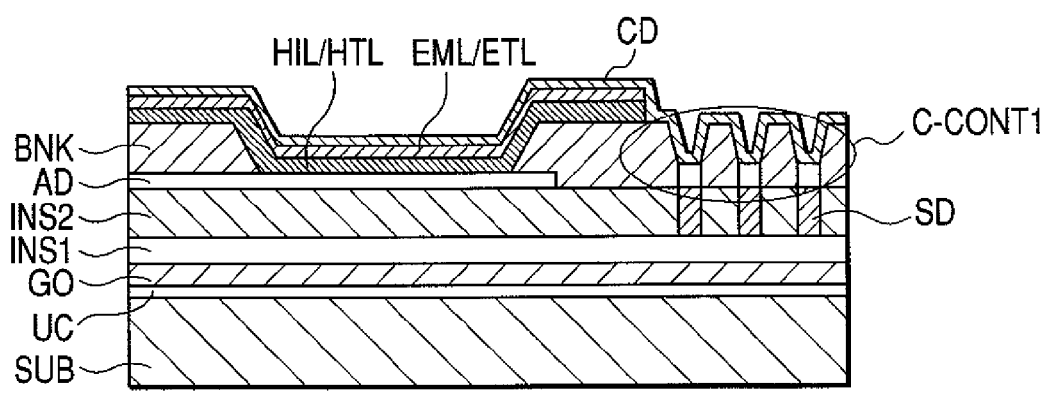
FIG. 4 is a sectional view of a cathode contact portion of an active matrix substrate in a conventional organic EL display device.

As a result of studies made by the present inventor it turned out that the power consumption could be decreased by using the vapor deposition mask of the first embodiment and by using the following structure. FIG. 4 is a sectional view of a cathode contact portion of an active matrix substrate in a conventional organic EL display device. According to the illustrated structure, a base layer UC, a gate oxide film layer GO, a first interlayer insulating layer INS1, a source-drain metal layer SD, a second interlayer insulating layer INS2, a lower electrode layer AD, a bank BNK, a hole injection layer HIL, a hole transport layer HTL, a luminescence layer EML, an electron transport layer ETL, and an upper electrode layer CD are stacked in this order on a glass substrate SUB. A cathode contact C-CONT1 is formed in part of the substrate. The cathode contact C-CONT1 has a laminate structure comprising the source-drain electrode layer and the lower electrode layer AD formed thereon, which structure is formed as a connection pad in an area adjacent to the pixel area. A cathode electrode as an upper electrode is formed from both above the organic layer in the pixel area and above the cathode contact C-CONT1 and is connected to the cathode contact C-CONT1 for the supply of voltage.

The substrate SUB is made of alkali-free glass having a thickness of 0.7 mm. The base layer UC is composed of a silicon nitride layer 150 nm in thickness formed by plasma CVD and a silicon oxide layer 100 nm in thickness. The silicon oxide layer GO is constituted by a silicon oxide layer 110 nm in thickness generally called TEOS film. The first interlayer insulating film INS1 is constituted by SiO 500 nm in thickness formed by plasma CVD on TEOS film of a gate oxide film GI. The source-drain metal layer SD is constituted by a laminate structure of MoW/AlN/MoW having thicknesses of 38 nm, 500 nm and 75 nm, respectively. This source-drain electrode layer is used not only as a pixel circuit but also as a part of the cathode contact adjacent to the pixel area. The second interlayer insulating film INS2 is constituted by a 500 nm thick SiN film formed by plasma CVD on the first interlayer insulating film INS1. On the second interlayer insulating film INS2 and outside the pixel area there is formed a contact hole connected to the source-drain electrode layer SD functioning as the cathode contact C-CONT1.

On the second interlayer insulating film INS2 the lower electrode layer AD is formed for each pixel as a lower electrode. Also on the source-drain metal electrode layer SD there is formed as the cathode contact CONT1, a pad electrode is formed together with the lower electrode. This lower electrode and the pad ITO electrode formed as a pad on the cathode contact C-CONT1 are constituted by ITO having a thickness of 77 nm.

The bank BNK is constituted by SiN formed by plasma CVD in such a manner as to cover the lower electrode AD and also cover the second interlayer insulating film between pixels from above and thereby ensure the insulation between pixels. Moreover, the bank BNK has an aperture on a part of the source-drain electrode layer SD formed as the cathode contact and is formed so as to cover along the outer periphery of the aperture. A laminate of the hole injection layer HIL serving as an organic layer, hole transport layer HTL, luminescence layer EML and electron transport layer ETL, which are formed in this order by a vacuum deposition method, is formed on the lower electrode and the bank both exposed from the aperture. Heretofore there has been a long distance (unformed area) up to the cathode contact C-CONT1. The upper electrode is common to plural pixels and is formed from the whole display surface up to above the cathode contact C-CONT1 by a vacuum deposition method.

As described above, the cathode as the upper electrode CD is formed by a vacuum deposition method. It is necessary that the metal formed as the cathode be maintained in a state of good vapor deposition for the luminescence layer and be connected in a satisfactory manner to the cathode contact C-CONT which is installed on the substrate SUB of the organic EL display device. If the connection with the cathode is not in a satisfactory state, a connection resistance of the cathode acts during luminescent operation of the display device, thus giving rise to such problems as an increase in operation voltage of the device and an increase of power consumption.

In the course of checking the operation of the organic EL display device and disassembling and investigating the device the present inventor reached the conclusion that in order to decrease the connection resistance between the cathode and the cathode C-CONT it was effective to interpose the organic layer EML between the cathode and the cathode contact C-CONT1.

This is for the following reason. For example, Al is usually employed as the cathode metal and it is preferable that the vapor deposition temperature of Al be 1000° C. or higher. On the other hand, the temperature of an OLED substrate on which the cathode is formed is 30° to 40° C. In this connection, the present inventor has noticed that the vapor-deposited Al is cooled 900° C. or more at a stretch from the state of vapor of 1000° C. or higher and is thereby formed as a film on the OLED substrate.

Since the temperature drops rapidly when the cathode is thus formed into a film, the cathode shrinks and there occurs a film stress. The present inventor has presumed that due to this film stress there occurs a connection resistance of the cathode in the luminescent layer and the cathode contact C-CONT1 (the cathode connection on the substrate).

However, it has turned out that the cathode connection resistance does not increase on the organic layer of the organic EL display device. Therefore, having conducted a verification experiment on the assumption that the soft organic luminescence layer serves as a cushion and absorbs thermal shrinkage of the cathode metal, the present inventor found out that not the whole but a part of the cathode contact portion was effective in decreasing the cathode connection resistance by interposing an organic luminescence layer in the area concerned. It also turned out that the cathode connection resistance increased when going through the hole injection layer HIL and the hole transport layer HTL as a part of the organic layer.

In this connection, a description will now be given about an organic EL element which, by making an organic layer present also in part of the cathode connection, i.e., cathode contact C-CONT 1, on the substrate, made it possible to decrease the cathode connection resistance, thereby suppress the increase of the device driving voltage and attain a lower power consumption. This actually can be effected by suitably designing the aperture portion of the vapor deposition mask.

Figure 5:
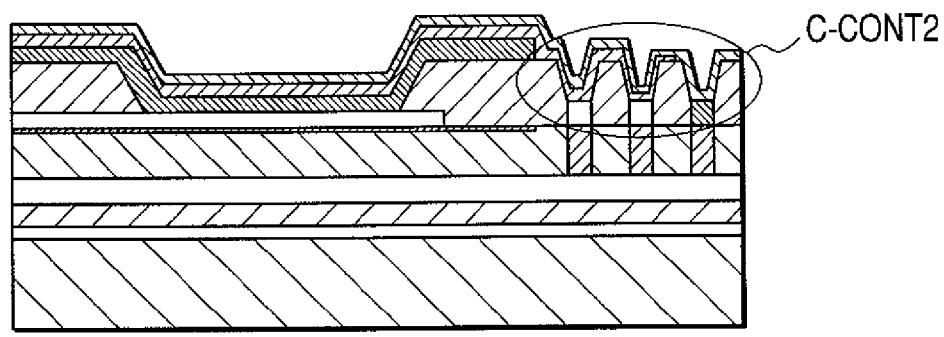
FIG. 5 is a sectional view of a cathode contact portion of an active matrix substrate in an organic EL display device according to a second embodiment of the present invention.

FIG. 5 is a sectional view of a cathode contact and the vicinity thereof of an active matrix substrate in an organic El display device according to the present invention. In a typical conventional bottom emission type organic EL display device, a luminescence layer EML and an electron transport layer ETL are vapor-deposited in approximately the same size as the pixel area (FIG. 4), while in the structure of this embodiment a film is formed beyond the pixel area and up to the second contact hole in the cathode contact C-CONT2 (FIG. 5).

Preferably, a luminescence layer EML or an electron transport layer ETL is made present 60% or less of the cathode contact C-CONT2 or in the vicinity (within 150 μm) of the cathode contact C-CONT2. Conversely, a hole injection layer HIL and a hole transport layer HTL are not formed. In the case where the cathode contact C-CONT2 is constituted by plural rows and columns of contact holes, it is preferable not to cover all the contact holes but to leave at least one row and one column of contact holes unvapor-deposited. That is, contact holes present near pixels are covered both luminescence layer EML and electron transport layer ETL, while contact holes remote from pixels are not covered.

[Third Embodiment]

Figure 6:
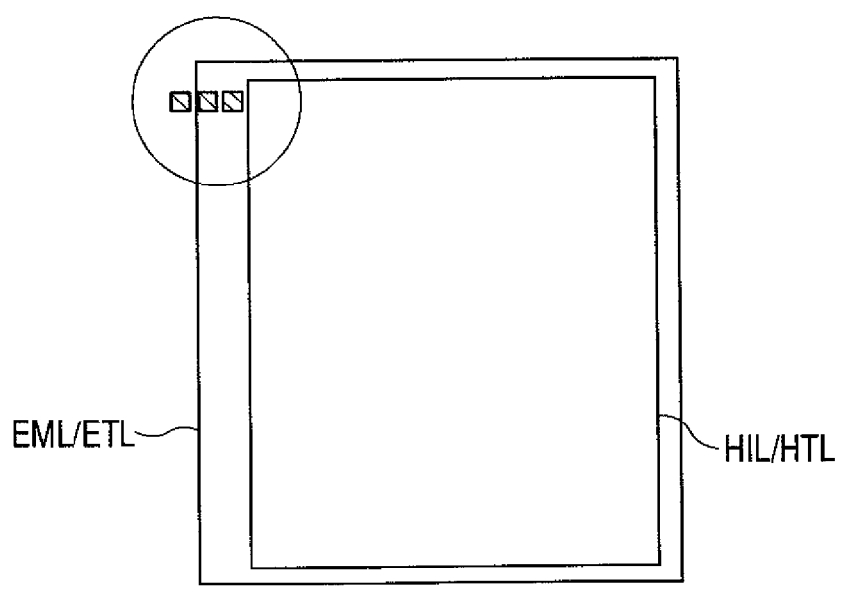
FIG. 6 is a diagram showing a vapor deposition area of an organic EL display device according to a third embodiment of the present invention.

A vapor deposition area of an organic EL display device according to a third embodiment of the present invention is shown in FIG. 6. A different point from the second embodiment is that at each side a vapor deposition area of a luminescence layer EML and an electron transport layer ETL is wider than a vapor deposition area of a hole injection layer HIL and a hole transport layer HTL.

Figure 7:
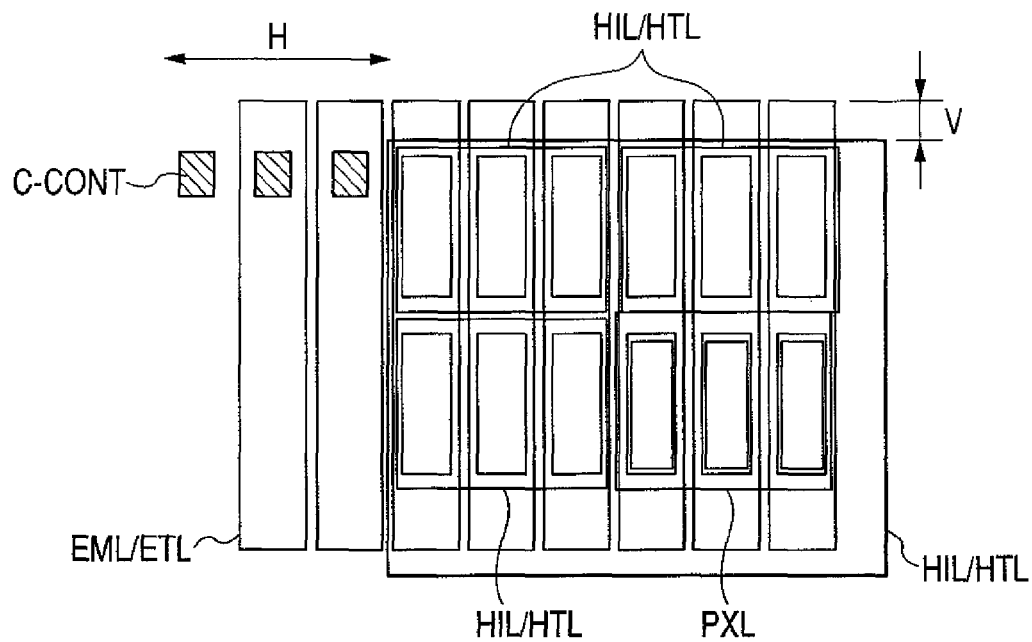
FIG. 7 is an enlarged diagram of a circular area (a left upper end portion of a pixel area) shown in FIG. 6.

FIG. 7 is an enlarged diagram of a circled area, i.e., a left upper end portion of the pixel area, in FIG. 6. A double square area located on the right lower side is a display pixel area PXL. In the display pixel area PXL are disposed three pixels of RGB as one set. On upper, left and obliquely upper sides of those display pixels there is formed an organic EML like the display pixels. Dummy pixels of RGB with aperture not formed in the BNK are each arranged one set, i.e., a total of three sets. A hole injection layer HIL and a hole transport layer HTL are vapor-deposited as solid vapor deposition, i.e., throughout the sole surface, in the area where the display pixel area PXL and the dummy pixel area D-PXL are formed. Moreover, a luminescence layer EML and an electron transport layer ETL are arranged two sets each in a total of three RGB columns in the pixel area RGB.

Further, in width V in the column direction and width H in the row direction in this pixel area, the luminescence layer EML and the electron transport layer ETL are arranged in a total of two GB columns. That is, in the pixel area RGB and in the exterior of the pixel area, the luminescence layer EML and the electron transport layer ETL are vapor-deposited protrudedly by width V in the column direction from the vapor deposition area of the hole injection layer HIL and the hole transport layer HTL, and are vapor-deposited protrudedly by width H (corresponding to two GB rows of the luminescence layer EML and the electron transport layer ETL) in the row direction. It follows that the luminescence layer EML and the electron transport layer ETL are formed up to the area where two cathode contacts C-CONT2 are disposed.

[Fourth Embodiment]

Figure 8:
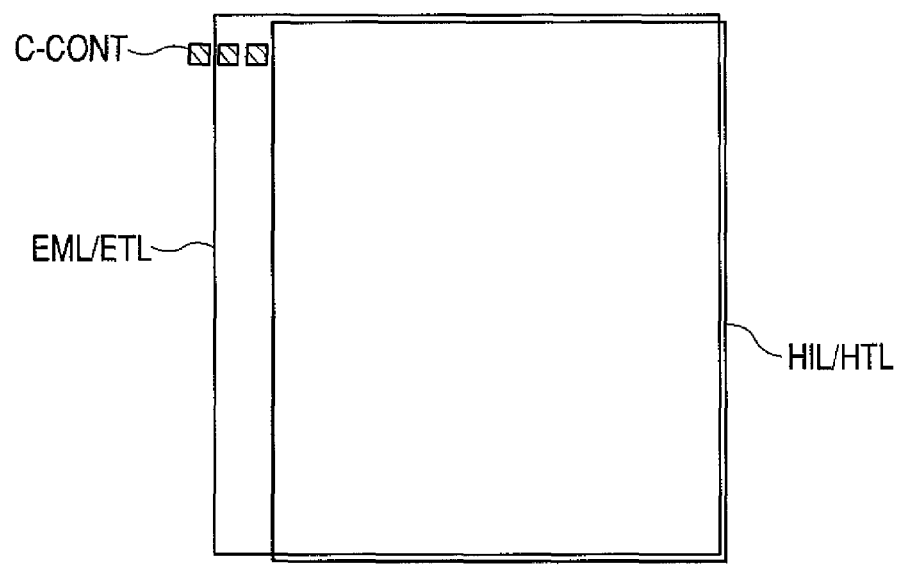
FIG. 8 is a diagram showing a vapor deposition area of an organic EL display device according to a fourth embodiment of the present invention.

A vapor deposition area of an organic EL display device according to a fourth embodiment of the present invention is shown in FIG. 8. A different point from the second embodiment is that a deposition area of a luminescence layer EML and an electron transport layer is wide in only the row direction with respect to a vapor deposition area of a hole injection layer HIL and a hole transport layer HTL.

[Fifth Embodiment]

Figure 9:
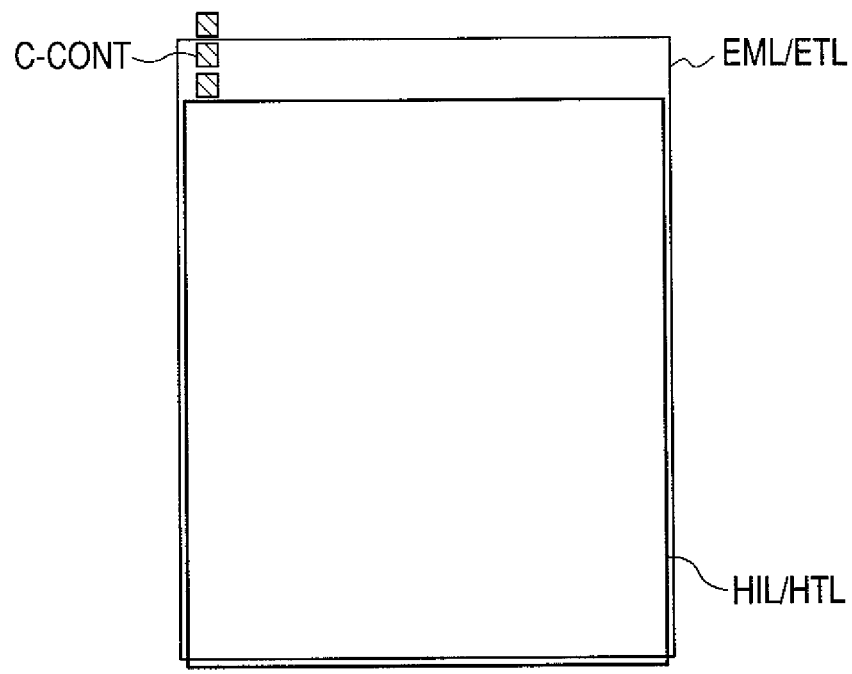
FIG. 9 is a diagram showing a vapor deposition area of an organic EL display device according to a fifth embodiment of the present invention.

A vapor deposition area of an organic EL display device according to a fifth embodiment of the present invention is shown in FIG. 9. A different point from the second embodiment is that a vapor deposition area of a luminescence layer EML and an electron transport layer is wide in only the column direction with respect to a vapor deposition area of a hole injection layer HIL and a hole transport layer HTL.

[Sixth Embodiment]

Figure 10:
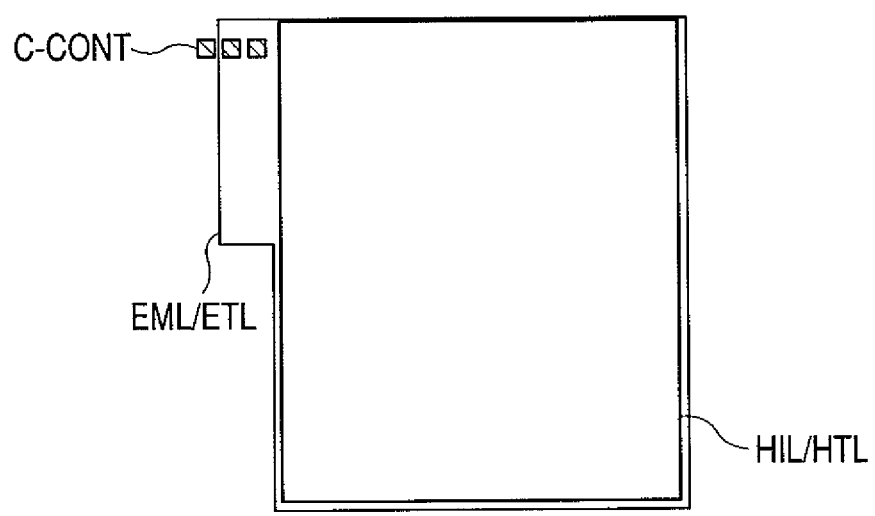
FIG. 10 is a diagram showing a vapor deposition area of an organic EL display device according to a sixth embodiment of the present invention.

A vapor deposition area of an organic EL display device according to a sixth embodiment of the present invention is shown in FIG. 10. A different point from the fourth embodiment is that a vapor deposition area of a luminescence layer EML and an electron transport layer is wide in only a part of a side with respect to a vapor deposition area of a hole injection layer HIL and a hole transport layer HTL.

In connection with the above second to sixth embodiments, the following modifications are also included in the present invention.

(1) When the area where the hole injection layer HIL and the hole transport layer HTL are formed and the area where the luminescence layer EML and the electron transport layer ETL are formed are the same, the luminescence layer EML or the electron transport layer ETL may be made present independently.

(2) It is preferable that the luminescence layer EML or the electron transport layer ETL be formed 60% or less of the area of the cathode contact C-CONT2 or in the vicinity (within 150 μm) of the cathode contact C-CONT2. However, in the case of a pattern wherein the hole injection layer HIL and the hole transport layer HTL are the narrower, it is preferable that the hole injection layer HIL and the hole transport layer HTL be not formed near the cathode contact C-CONT2 although they may be present partially.

It can be said that the following effect is obtained by the second to sixth embodiments. Film stress induced in the cathode contact portion can be mitigated by EML or ETL which is formed in the cathode contact portion, with the result that it is possible to attain a satisfactory conduction with the cathode contact. Particularly, the luminescence layer EML is formed of an electrically conductive material although the hole injection layer HIL and the hole transport layer HTL are formed of an insulating material, so even if the luminescence layer EML is formed in the cathode contact portion and thereafter an anode metal is formed into a film, such a fatal disconnection as obstructs the conduction itself will never occur even if the resistance value increases slightly.

What is claimed is:

1. An organic electroluminescence display device comprising a plurality of organic electroluminescence elements each having an anode, a cathode and an organic layer sandwiched in between the anode and the cathode, the plurality of organic electroluminescence elements being arranged in a matrix shape to form a display area,
wherein: the cathode extends to the exterior of the display area and is supplied with cathode voltage through a plurality of contact holes that are located at an area which is exterior of the display area; and
contact pads are formed at the bottoms of the plurality of the contact holes, and a part of the organic layer is sandwiched between the cathode and at least one of the contact pads located in at least one of the contact holes, and
wherein, at the at least one contact hole, the part of the organic layer, the cathode and the contact pad are configured and located relative to one another so that a current can flow between the cathode and the contact pad through the part of the organic layer.

2. An organic electroluminescence display device comprising a plurality of organic electroluminescence elements each having an anode, a cathode and an organic layer sandwiched in between the anode and the cathode, the plurality of organic electroluminescence elements being arranged in a matrix shape to form a display area,
wherein: the organic layer includes a hole injection layer, a hole transport layer, a luminescence layer and an electron transport layer;
the cathode includes a cathode contact area that is formed in common to the plural organic electroluminescence elements;
the cathode extends to the exterior of the display area and is supplied with cathode voltage through a plurality of contact holes that are located at an area which is exterior of the display area; and
contact pads are formed at the bottoms of the plurality of the contact holes, and a part of the organic layer is sandwiched between the cathode and the at least one of the contact pads located in at least one of the contact holes, and
wherein, at the at least one contact hole, the part of the organic layer, the cathode and the contact pad are configured and located relative to one another so that a current can flow between the cathode and the contact pad through the part of the organic layer.

3. The organic electroluminescence display device according to claim 2,
wherein the part of the organic layer comprises the luminescence layer and the electron transport layer.

4. The organic electroluminescence display device according to claim 2,
wherein the part of the organic layer is formed in the contact holes located near the display area out of the plural contact holes.

5. The organic electroluminescence display device according to claim 1,
wherein the plurality of contact holes include a first contact hole and a second contact hole, wherein the first contact hole is located closer to the display area than the second contact hole, and wherein the part of the organic layer covers the first contact hole but does not cover the second contact hole.

6. The organic electroluminescence display device according to claim 2,
wherein the plurality of contact holes include a first contact hole and a second contact hole, wherein the first contact hole is located closer to the display area than the second contact hole, and wherein the part of the organic layer covers the first contact hole but does not cover the second contact hole.

7. The organic electroluminescence display device according to claim 1,
wherein the cathode directly contacts with the part of the organic layer at an upper portion of the at least one contact hole where the part of the organic layer is sandwiched between the contact pad in the at least contact hole and a portion of the cathode located at the upper portion of the at least one contact hole.

8. The organic electroluminescence display device according to claim 2,
wherein the cathode directly contacts with the part of the organic layer at an upper portion of the at least one contact hole where the part of the organic layer is sandwiched between the contact pad in the at least contact hole and a portion of the cathode located at the upper portion of the at least one contact hole.

* * * * *